US009535093B2

(12) United States Patent
Chang et al.

(10) Patent No.: US 9,535,093 B2
(45) Date of Patent: *Jan. 3, 2017

(54) HIGH FREQUENCY PROBE CARD FOR PROBING PHOTOELECTRIC DEVICE

(71) Applicant: MPI CORPORATION, Chu-Pei, Hsinchu Shien (TW)

(72) Inventors: Chia-Tai Chang, Chu-Pei (TW); Hui-Pin Yang, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 182 days.

This patent is subject to a terminal disclaimer.

(21) Appl. No.: 14/338,797

(22) Filed: Jul. 23, 2014

(65) Prior Publication Data

US 2015/0028911 A1    Jan. 29, 2015

(30) Foreign Application Priority Data

Jul. 23, 2013 (TW) .............................. 102126339 A

(51) Int. Cl.
*G01R 1/067* (2006.01)
*G01R 1/073* (2006.01)

(52) U.S. Cl.
CPC ....... *G01R 1/06772* (2013.01); *G01R 1/07307* (2013.01); *G01R 1/07342* (2013.01)

(58) Field of Classification Search
None
See application file for complete search history.

(56) References Cited

U.S. PATENT DOCUMENTS 7,576,553 B2 * 8/2009 Lou ................... G01R 31/2891
324/750.03
7,595,651 B2    9/2009 Ku et al.
9,201,098 B2 * 12/2015 Chang ................ G01R 1/07342

FOREIGN PATENT DOCUMENTS

JP    1994-50991 A     2/1994
JP    2790074 B2       8/1998
JP    4060984 B2       3/2008
JP    4759577 B2       8/2011
WO   2008/059767 A1   5/2008

* cited by examiner

*Primary Examiner* — Paresh Patel
(74) *Attorney, Agent, or Firm* — Muncy, Geissler, Olds & Lowe, P.C.

(57) ABSTRACT

A high frequency probe card for probing a photoelectric device includes a substrate having a first opening and at least one first through hole, an interposing plate disposed on the substrate and having a second opening and at least one second through hole, a circuit board disposed on the interposing plate and having a third opening and at least one third through hole, and a probe module mounted to the substrate and having at least one ground probe and at least one high-frequency impedance matching probe having a signal transmitting structure and a grounding structure passing through the at least one first, second and third through holes and being electrically connected with a signal pad and a ground pad of the circuit board, respectively. The first, second and third openings are communicated with each other for light transmission.

17 Claims, 13 Drawing Sheets

HIGH FREQUENCY PROBE CARD FOR PROBING PHOTOELECTRIC DEVICE

CROSS-REFERENCE TO RELATED APPLICATIONS

This application claims priority from Taiwan Patent Application No. 102126339 filed on Jul. 23, 2013, the entire content of which is incorporated herein by reference.

BACKGROUND OF THE INVENTION

1. Field of the Invention

The present invention relates to probe cards for probing devices under test and more particularly, to a high frequency probe card for probing a photoelectric device.

2. Description of the Related Art

In a task of testing semiconductor chip, the tester is indirectly and electrically connected with a device under test (hereinafter referred to as 'DUT') through a probe card. The conventional probe card is generally composed of a circuit board and a plurality of probes. On the top surface of the circuit board, a plurality of top contact pads for being electrically contacted by the tester are provided. The bottom surface of the circuit board is provided with bottom contact pads electrically connected with the top contact pads. The probes are respectively soldered to the bottom contact pads and arranged in a pattern corresponding to that of contacts of the DUT. When the probes contact the corresponding contacts of the DUT respectively, they can transmit the testing signals from the tester to the DUT for enabling the tester to detect and measure the electric characteristics of the DUT.

The probe card designed for testing image sensing devices, such as CMOS image sensors, or other photoelectric devices further comprises an opening in which a lens module is mounted. When the probe card probes the DUT, testing light can reach on the DUT through the lens module. After the DUT receives the testing light, the DUT converts the testing light to electric signal, which is transmitted to the tester through the probe card for enabling the tester to analyze characteristics of the DUT.

Nowadays, the lens modules used in electronic devices usually have a smaller size with a larger numbers of pixels; therefore, the photoelectric device usually works under a high frequency condition. In order to transmit the high frequency testing signals effectively, the probe card must have a certain impedance matching with those of the tester and the DUT so as to accurately reflect the test result. However, the commercially available probe cards for probing photoelectric devices cannot fulfill the requirement of high frequency testing at present.

In another aspect, the top contact pads of the circuit board of the probe card are electrically connected with the bottom contact pads through an internal circuit layout of the circuit board. Therefore, it is difficult in manufacturing such a circuit board, and the signals may not be smoothly transmitted due to the fact that the internal circuit layout may have many bends and curves. Further, if the internal circuit layout of the circuit board is configured having a high frequency signal trace accompanying a grounding trace for impedance matching, the circuit board will be more difficultly manufactured.

SUMMARY OF THE INVENTION

The present invention has been accomplished under the circumstances in view. It is an objective of the present invention to provide a high frequency probe card for probing a photoelectric device, which can fulfil requirement of high frequency testing and transmit the testing signal smoothly, and can be easily made.

To achieve the above-mentioned objective, the high frequency probe card for probing a photoelectric device provided by the present invention comprises a substrate, an interposing plate, a circuit board and a probe module. The substrate has a first opening for light transmission, and at least one first through hole. The interposing plate is disposed on the substrate and provided with a second opening communicated with the first opening for light transmission, and at least one second through hole communicated with the at least one first through hole. The circuit board has a top surface, a bottom surface disposed on the interposing plate, at least one ground pad and at least one signal pad arranged on the top surface, a third opening penetrating through the top and bottom surfaces and being communicated with the second opening for light transmission, and at least one third through hole penetrating through the top and bottom surfaces and being communicated with the at least one second through hole. The probe module is mounted to the substrate and provided with at least one ground probe and at least one high-frequency impedance matching probe. The high-frequency impedance matching probe has a signal transmitting structure and a grounding structure, which pass through the at least one first, second and third through holes. The signal transmitting structure and the grounding structure are electrically connected with the signal pad and the ground pad of the circuit board, respectively.

By means of the above-mentioned design, the first, second and third openings can combinedly form a space that accommodates a lens module, through which a testing light may reach on the DUT. Therefore, the probe card of the present invention can be used to inspect a photoelectric device. The high-frequency impedance matching probe of the probe card may have a certain impedance matching with those of the tester and the DUT, such that the high frequency probe card of the present invention can fulfil requirement of high frequency testing. Further, the high-frequency impedance matching probe penetrates through the substrate, the interposing plate and the circuit board and has a signal transmitting structure electrically connected with the signal pad on the top surface of the circuit board. The signal pads are formed by a circuit layout on the top surface of the circuit board for being electrically contacted by testing contacts of a tester; therefore, the testing signal needs not to be transmitted through the internal circuit layout of the circuit board. In this way, the testing signal can be transmitted smoothly and the circuit board can be more easily made.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF EMBODIMENTS

Figure 1:
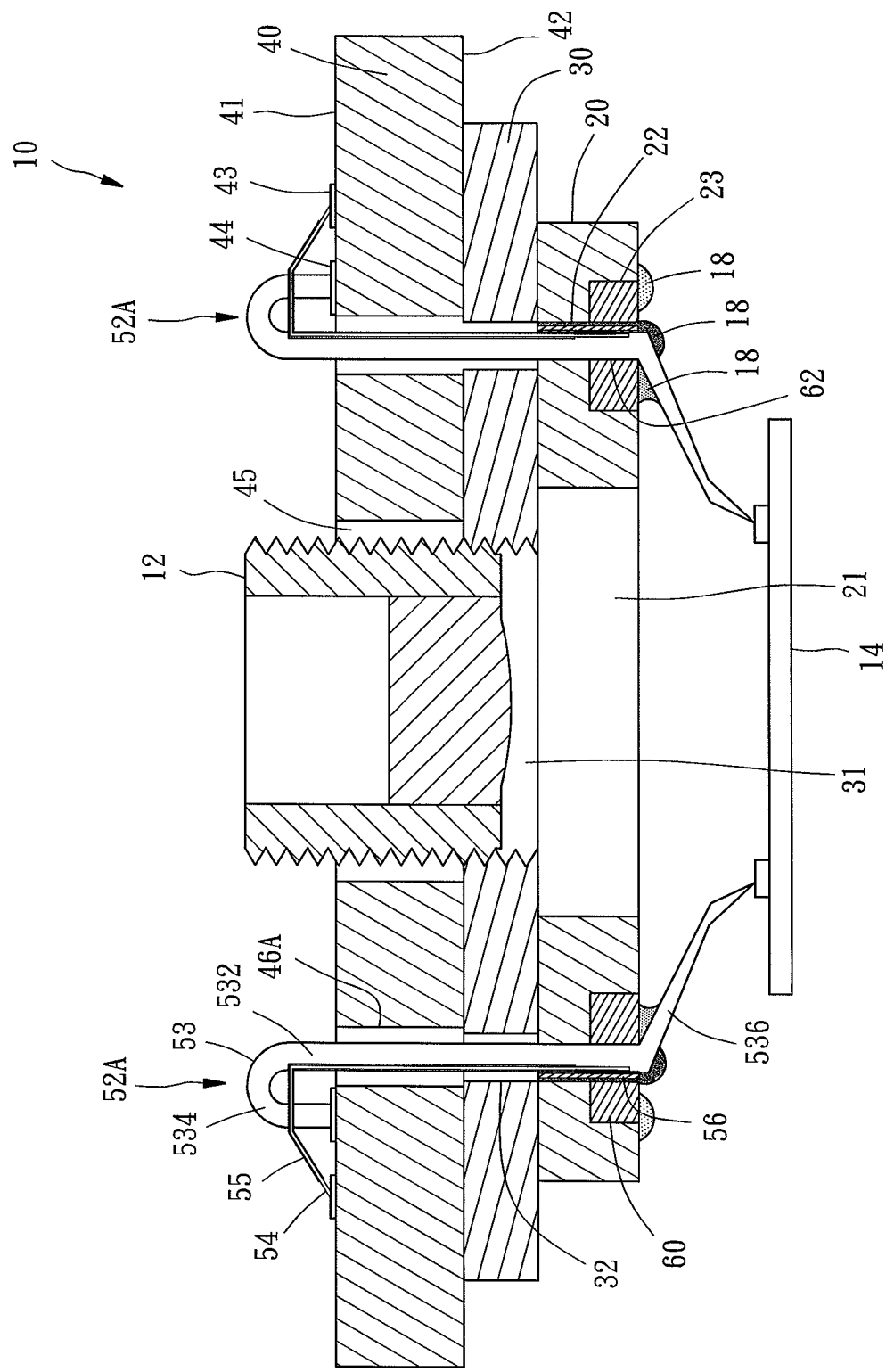
FIG. 1 is a cross-sectional view of a high frequency probe card for probing a photoelectric device according to a first embodiment of the present invention, in which high-frequency impedance matching probes of a first kind and a device under test are shown.

Reference will now be made in detail to the exemplary embodiments of the present invention, examples of which are illustrated in the accompanying drawings. Wherever possible, the same reference numerals are used in the drawings and the description to refer to the same or like parts.

Figure 2:
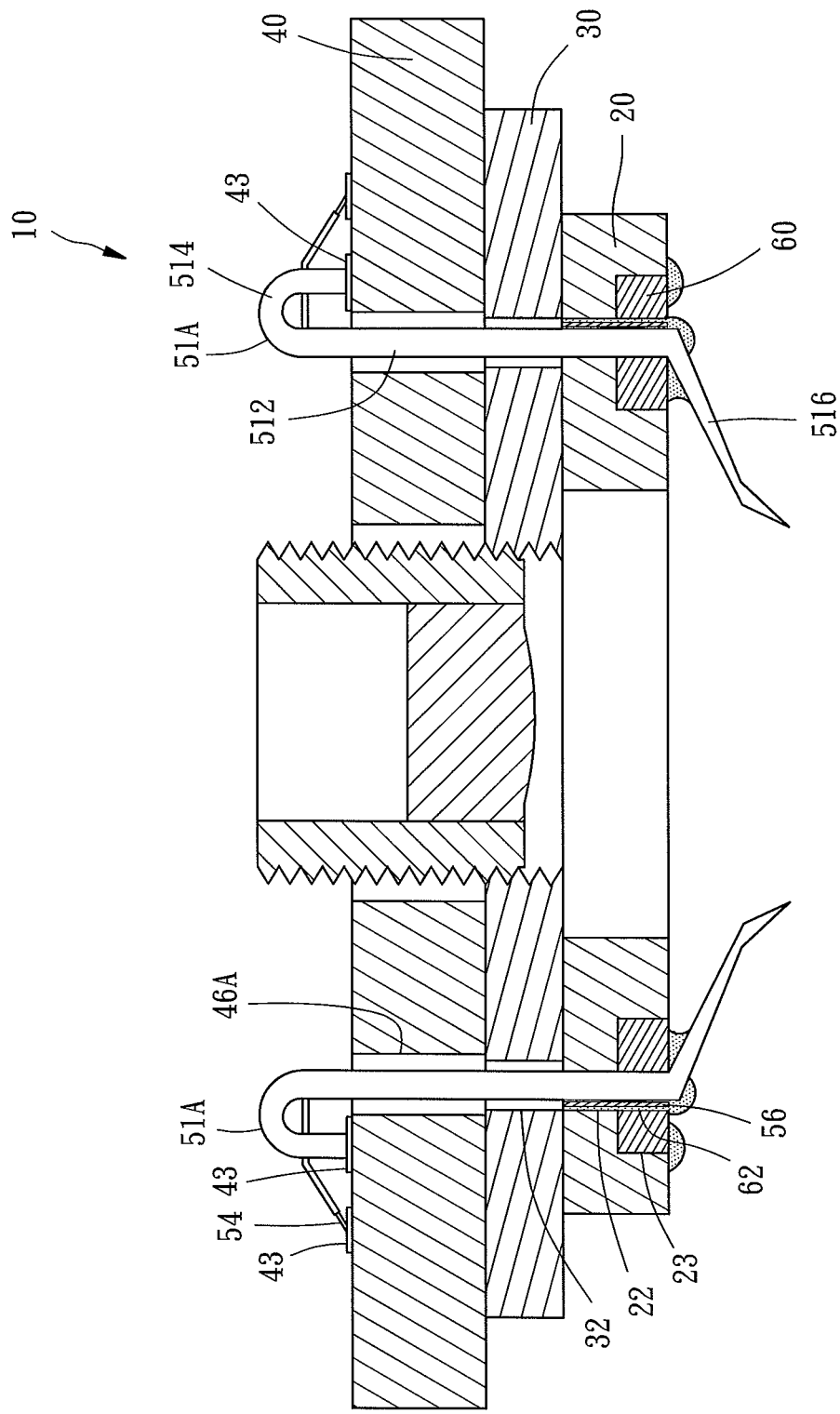
FIG. 2 is another cross-sectional view of the high frequency probe card of the first embodiment of the present invention, in which ground probes of a first kind is shown.
Figure 3:
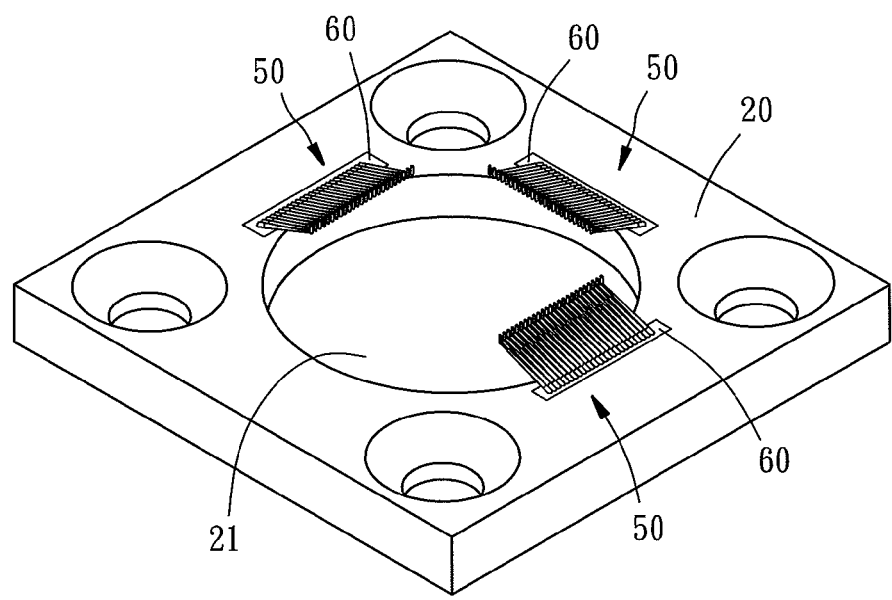
FIG. 3 is a schematic perspective view showing the arrangement of a substrate, three probe modules and three fixing members of the high frequency probe card.
Figure 4:
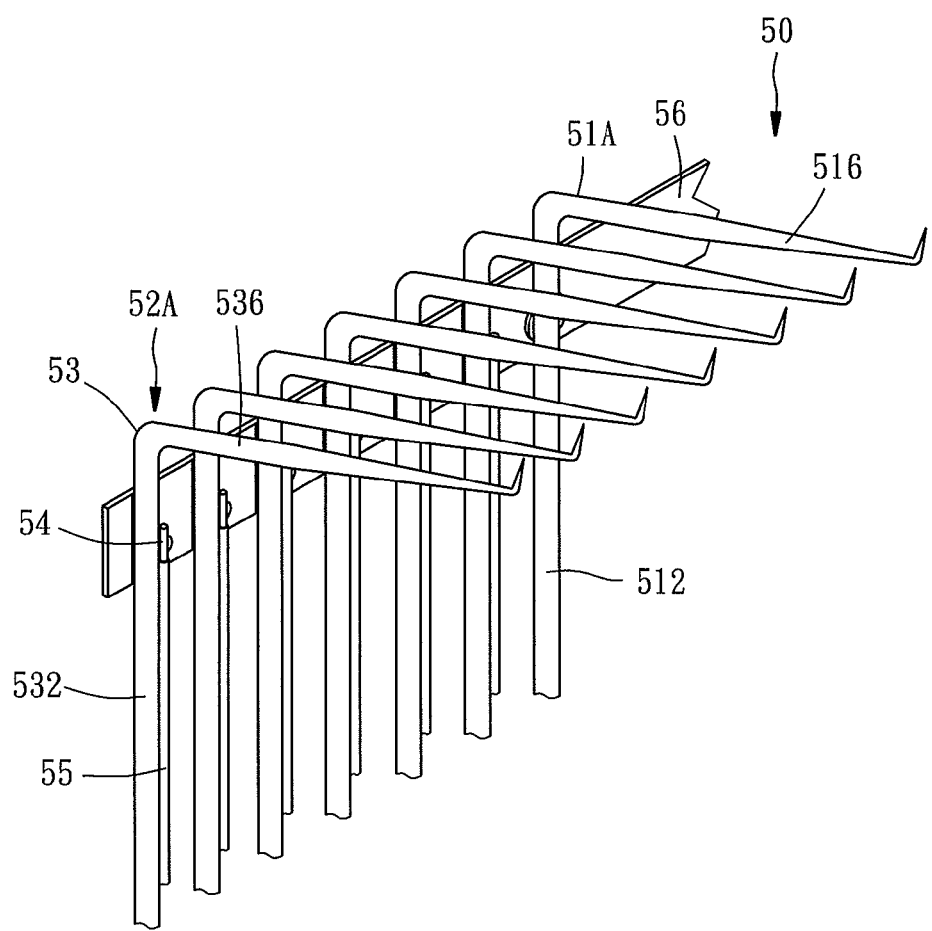
FIG. 4 is a schematic perspective view showing the probe module having the high-frequency impedance matching probes of the first kind and the ground probe of the first kind.

FIGS. 1-2 are schematic cross-sectional views of a high frequency probe card for probing a photoelectric device according to a first embodiment of the present invention. As shown in FIGS. 1-4, the high frequency probe card 10 mainly comprises a substrate 20, an interposing plate 30, a circuit board 40, and three probe modules 50. The number of the probe modules 50 is not limited to three. One or more probe modules 50 can be used in accordance to actual need. In other words, the high frequency probe card 10 of the present invention may include at least one probe module 50. FIG. 3 is a schematic perspective view showing that each probe module 50 is fixedly mounted to the substrate 20 through a fixing member 60. FIG. 4 is a schematic perspective view of one probe module 50.

The probe module 50 includes a ground probe 51A and a plurality of high-frequency impedance matching probes 52A. The number of the high-frequency impedance matching probes 52A may depend on actual need. In other words, the probe module 50 may include at least one ground probe 51A and at least one high-frequency impedance matching probe 52A. Each high-frequency impedance matching probe 52A is mainly composed of a needle 53 and a lead wire 54 configured in a way that the needle 53 and the lead wire 54 are electrically insulated from each other. Each of the ground probe 51A and the needle 53 is an N-type bare needle having an elongated body 512 or 532, a curved connection portion 514 or 534 at an end of the elongated body 512 or 532, and a detecting portion 516, 536 suspended from the other end of the elongated body 512 or 532. In this embodiment, the needle 53 and the lead wire 54 are electrically insulated from each other by an insulation member 55 encapsulating the lead wire 54. In fact, the lead wire 54 and the insulation member 55 combinedly form a so-called enamelled wire. However, the way of insulating the needle 53 from the lead wire 54 is not limited to the disclosure in this embodiment. For example, the needle 53 may be coated with a layer of insulation member.

Figure 5:
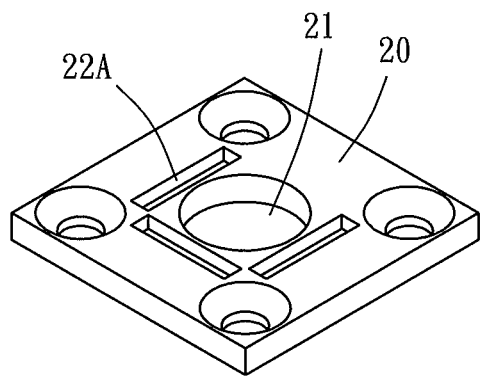
FIGS. 5 and 6 are schematic perspective views showing two alternate forms of the substrate of the high frequency probe card of the present invention.
Figure 6:
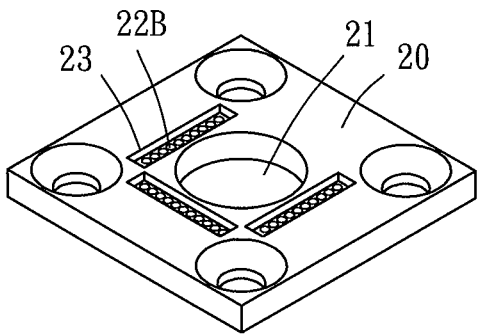

The substrate 20 has a first opening 21 for light transmission, and a plurality of first through holes 22 arranged around the periphery of the first opening 21 for insertion of the probes therethrough. Each first through hole 22 may be configured as an elongated through hole 22A, as shown in FIG. 5, such that the ground probe 51A and the high-frequency impedance matching probes 52A of a same probe module 50 can be inserted through a single first through hole 22A. It will be appreciated that the three elongated first through holes 22A shown in FIG. 5 may be designed to be communicated with each other so as to form a single U-shaped first through hole. As shown in FIG. 6, the first through holes 22 are configured as round through holes 22B provided in a groove 23. The round through holes 22B each have a relatively smaller diameter for insertion of a single ground probe 51A or a single high-frequency impedance matching probe 52A. It is to be understood that the substrate 20 may be designed having the first through holes 22B without any of the grooves 23.

The interposing plate 30 is mounted on the substrate 20 and provided with a second opening 31 communicated with the first opening 21 for light transmission, and at least one second through hole 32 communicated with the first through hole 22 for the passing of the probe(s). The structure of the second through hole 32 may be identical or similar to that of the first through hole 22. That is, the second through hole 32 may be an elongated through hole, a U-shaped through hole or a small through hole that allows passing of one single probe only.

The circuit board 40 has a top surface 41, a bottom surface 42 mounted on the interposing plate 30, a plurality of ground pads 43 and a plurality of signal pads 44 arranged on the top surface 41, and a third opening 45 and a plurality of third through holes 46A each penetrating through the top surface 44 and the bottom surface 42. It will be appreciated that the numbers of the ground pads 43 and the signal pads 44 are not specially limited. In other words, one or more ground pads 43 and signal pads 44 may be provided on the top surface 41 of the circuit board 40 in accordance with actual need. The third opening 45 is communicated with the second opening 31 for light transmission. The third through hole 46A is communicated with the second through hole 32, and the third through hole 46A is a small through hole that allows passing of one single probe only. It is to be understood that the number of the third through holes is not specially limited and may depend on the number of the probes that pass through the circuit board 40.

As shown in FIG. 1, the first opening 21, the second opening 31 and the third opening 41 combinedly form a space for accommodating a lens module 12, through which a testing light may reach on the DUT 14. Therefore, the probe card 10 of the present invention can be used to inspect photoelectric device. Specifically speaking, the lens module 12 is screwingly threaded to a wall of the second opening 31, such that the position of the lens module 12 can be adjusted. For high-frequency impedance matching probe 52A, the body 532 of the needle 53 and the lead wire 54 are spacedly abutted together and inserted through the first through hole 22, the second through hole 32 and the third through hole 46A in such a way that the connection portion 534 of the needle 53 is electrically connected with the signal pad 44 by soldering and the lead wire 54 is electrically connected with the ground pad 43 by soldering. In this way, the needle 53 of the high-frequency impedance matching probe 52A forms a signal transmitting structure electrically connected with the signal pad 44, and the lead wire 54 of the high-frequency impedance matching probe 52A forms a grounding structure electrically connected with the ground pad 43. As shown in FIG. 2, each ground probe 51A is inserted through the first through hole 22, the second through hole 32 and the third through hole 46A and soldered to one ground pad 43.

The signal pads 41 and the ground pads 43 are parts of a circuit layout on the top surface 41 of the circuit board 40 for being electrically contacted by testing contacts of a tester (not shown in the drawings) for enabling the detecting portion 536 of the needle 53 and the detecting portion 516 of the ground probe 51A to respectively transmit testing signal and ground voltage between the tester and the DUT 14. The needle 53 of the high-frequency impedance matching probe 52A may have a certain impedance matching with those of the tester and the DUT 14 because the needle 53 is accompanied with the grounded lead wire 54, such that the requirement of high frequency testing can be fulfilled. Further, the testing signal needs not to be transmitted through the internal circuit layout of the circuit board 40; therefore, the testing signal can be transmitted smoothly and the circuit board 40 can be more easily made.

Figure 7:
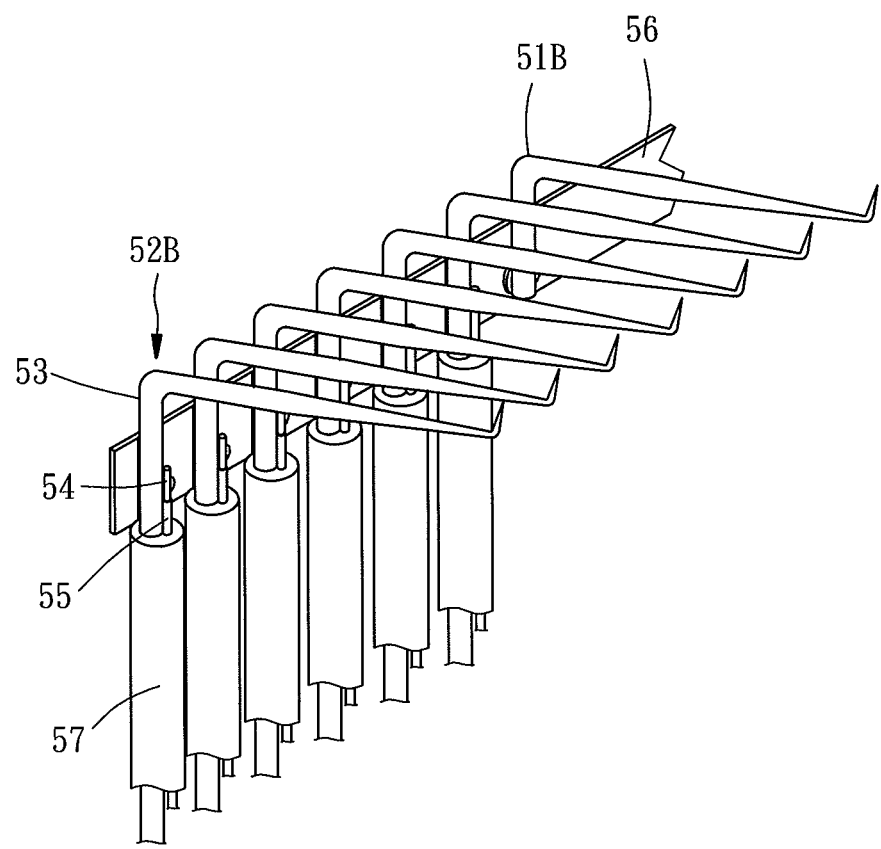
FIG. 7 is a schematic perspective view showing a probe module having high-frequency impedance matching probes of a second kind and a ground probe of a second kind.

As shown in FIG. 4, the probe module 50 may further include a conductor 56. By means of one or more insulated members, such as insulated adhesive or insulated sheets, the needles 53 are insulated from the conductor 56. The lead wires 54 and the ground probe 51A are electrically connected together via the conductor 56. Therefore, the lead wires 54 and the ground probe 51A are all grounded as long as one of them is soldered to one of the ground pads 43. Under this circumstance, the probe module 50 may adopt a short ground probe, such as the ground probe 51B shown in FIG. 7, which is shorter than the ground probe 51A disclosed in FIG. 4 and doesn't penetrate through the substrate 20, the interposing plate 30 and the circuit board 40. Further, the probe module 50 may also adopt the high-frequency impedance matching probes 52B shown in FIG. 7. Compared to the high-frequency impedance matching probe 52A, the high-frequency impedance matching probe 52B further comprises an insulation sleeve 57 sleeved onto the needle 53 and the lead wire 54 for ensuring that the needle 53 can be kept at a constant distance from the lead wire 54.

Figure 8:
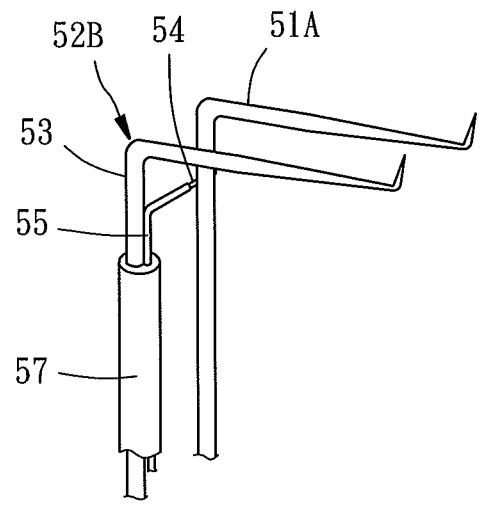
FIGS. 8 and 9 are schematic perspective views showing two alternate arrangements of the high-frequency impedance matching probe and the ground probe connected to the high-frequency impedance matching probe in a one-to-one manner.
Figure 9:
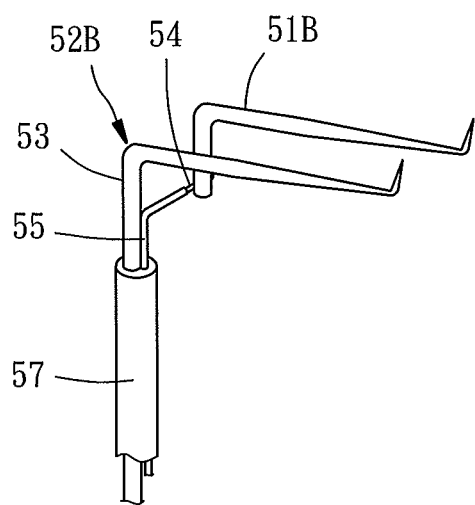

It is worth mentioning that the probe module is not limited to be configured having the one-to-many construction that one ground probe is in association with a plurality of high-frequency impedance matching probes. For example, the probe module may be configured having ground probes corresponding in number to high-frequency impedance matching probes in a one-to-one construction that one ground probe is in association with one high-frequency impedance matching probe. As shown in FIGS. 8 and 9, one single high-frequency impedance matching probe 52B is associated with one single ground probe 51A or 51B. In this case, an end of the lead wire 54 is directly connected with the ground probe 51A or 51B, such that the electric connection between the lead wire 54 and the ground probe 51A or 51B can be realized, and the other end of the lead wire 54 passes through the substrate 20, the interposing plate 30 and the circuit board 40 and is electrically connected with a ground pad 43 on the top surface 41 of the circuit board 40.

Figure 10:
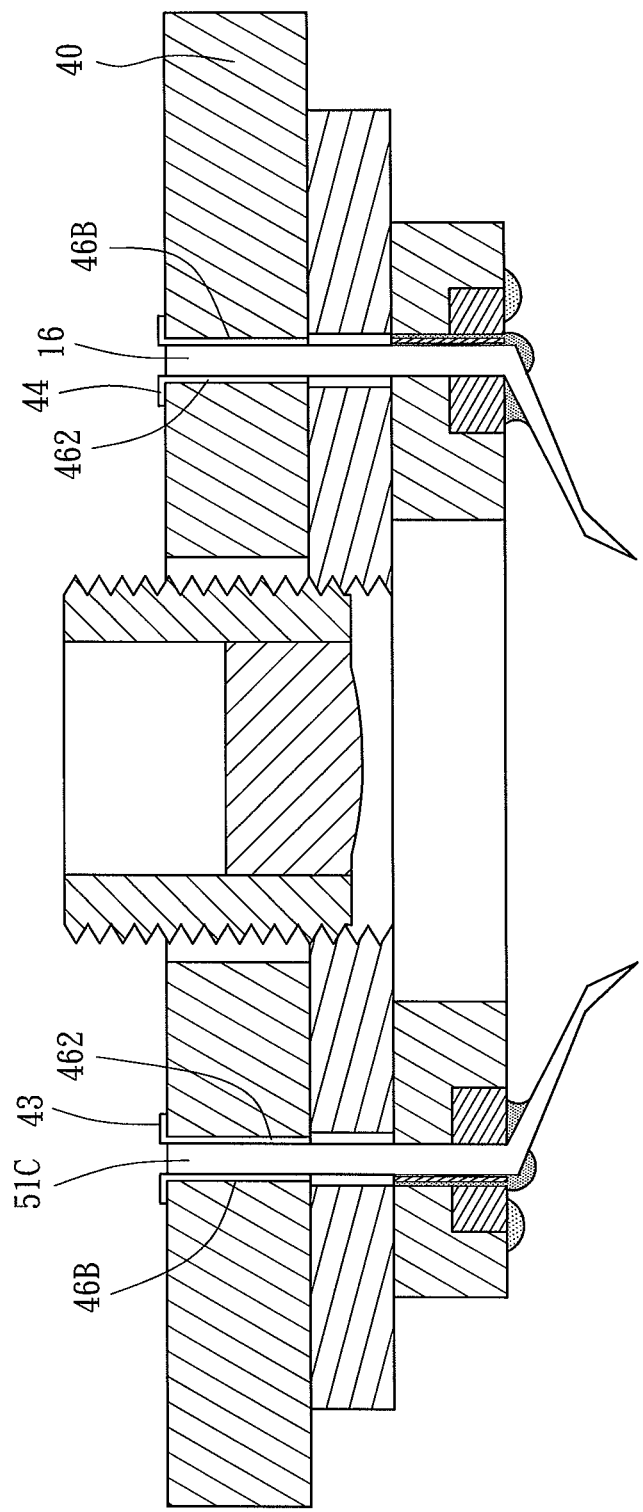
FIG. 10 is a cross-sectional view of the high frequency probe card of the present invention, showing that the circuit board has first conductive through holes in which a ground probe of the third kind and a regular probe are respectively inserted.

As shown in FIGS. 1 and 2, each third through hole 46A of the circuit board 40, which is adapted for passing of the ground probe 51A or the high-frequency impedance matching probe 52A, has a bare hole wall without any coating of conductive material. That is, the third through holes 46A are insulated through holes. However, the third through holes 46A of the circuit board 40 may include at least one first conductive through hole 46B as shown in FIG. 10. The first conductive through hole 46B has a hole wall provided with electrically conductive material 462, and an end of the first conductive through hole 46B is provided with or electrically connected through a circuit layout with a ground pad 43 or a signal pad 44 that is electrically connected with the electrically conductive material 462. As shown in left side of FIG. 10, a ground probe 51C is inserted in one first conductive through hole 46B and firmly contacted with the electrically conductive material 462, such that the ground probe 51C is electrically connected with the ground pad 43. As shown in right side of FIG. 10, a regular probe 16 for transmitting low or intermediate frequency signal is inserted in one first conductive through hole 46B and electrically connected with the signal pad 44 via the electrically conductive material 462.

Figure 11:
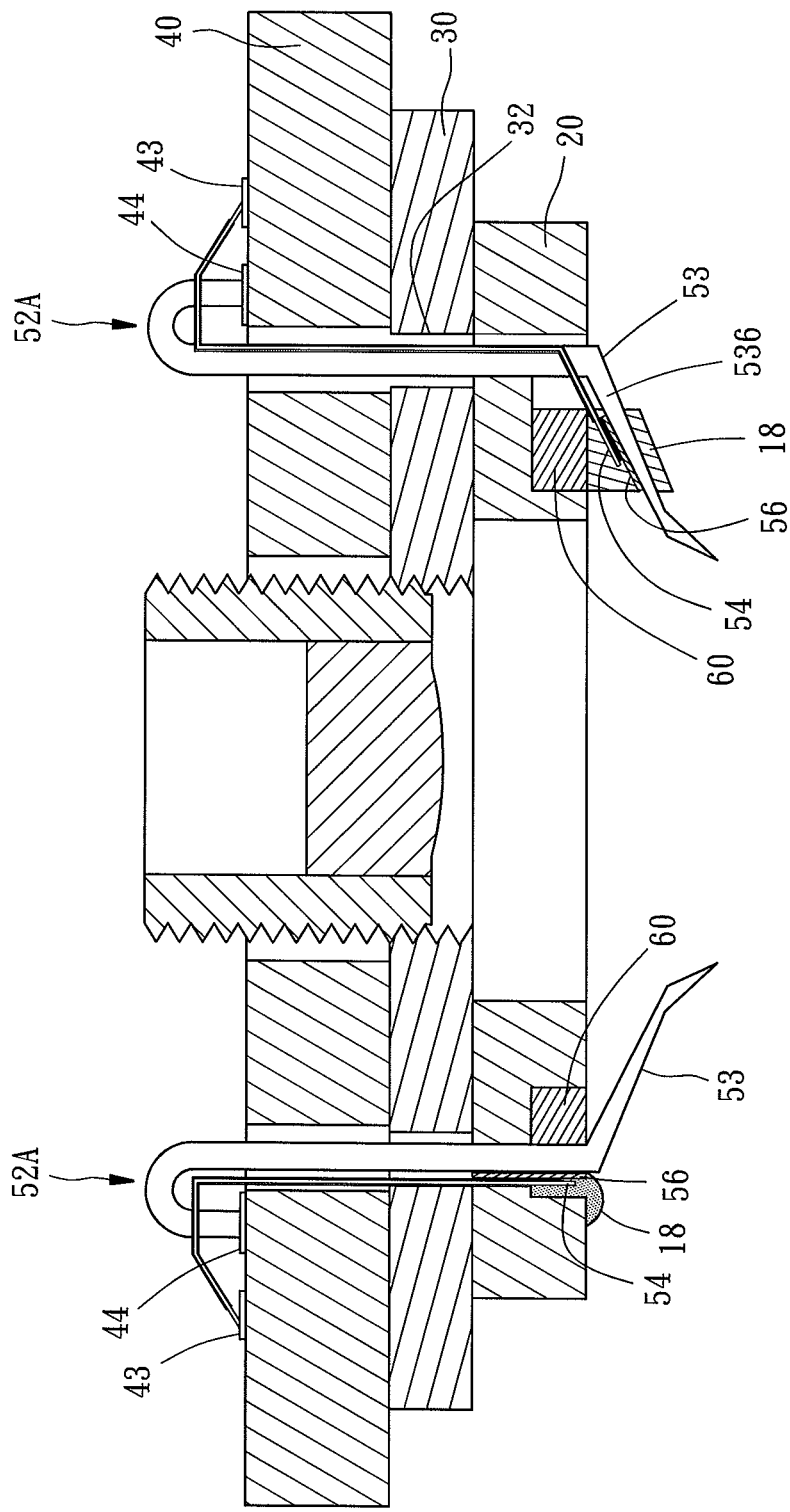
FIG. 11 is a cross-sectional view of the high frequency probe card of the present invention, showing two alternate arrangements of conductors of the probe module having the high-frequency impedance matching probes of the first kind.

In the above-mentioned probe nodules 50, the needles 53 and the lead wires 54 of the high-frequency impedance matching probes are arranged on the same lateral side of the conductor 56, and the conductor 56 is disposed in the first through hole 22 and corresponds in location to the body 532 of the needle 53. However, this arrangement can have various modifications. For example, as shown in left side of FIG. 11, the conductor 56 is arranged between the needle 53 and the lead wire 54. Further, as shown in right side of FIG. 11, the conductor 56 is arranged on the detecting portion 536 of the needle 53 and located outside the substrate 20. Furthermore, the conductor 56 can be arranged in the second through hole 32 of the interposing plate 30. As shown in left side of FIG. 12, the conductor 56 is arranged in the groove 23 of the substrate 20. In this case, the short ground probe 51B, which doesn't penetrate through the substrate 20, the interposing plate 30 and the circuit board 40, is used and electrically mounted to the conductor 56.

In the embodiment disclosed in FIGS. 1 and 2, the fixing members 60 for fixedly fastening the probes 51A and 52A to the substrate 20 are made of, but not limited to, engineering plastics, Bakelite or ceramic material. The fixing member 60 has through holes 62 for insertion of the probes 51A and 52A. In assembly, the probes 51A and 52A are inserted through the through holes 62 and then fixed with the fixing member 60 via adhesive. Thereafter, the fixing member 60 is mounted to the substrate 20, and then an adhesive 18, such as epoxy resin and the like, is applied to conjunction between the probes 51A and 52A and the fixing member 60, the probes 51A and 52A and the substrate 20, and/or the substrate 20 and the fixing member 60 so as to firmly fasten the fixing member 60 and the probes 51A and 52A to the substrate 20. It is to be understood that structure of the fixing member 60 and the arrangement of the adhesive 18 may have various modifications. For example, as shown in left side of FIG. 11, the fixing member 60 is configured without through holes. The fixing member 60 is inserted between the probes and the substrate 20 and firmly held in position by the adhesive 18. Further, as shown in right side of FIG. 11, the adhesive 18 is used to encapsulate a part of the detecting portion 536 of the needle 53 and the conductor 56 so as to secure the fastening relationship among the fixing member 60, probes and the conductor 56. It is to be further mentioned that the fixing member 60 may not be received in the groove 23. Instead, the fixing member 60 can be directly mounted on the surface of the substrate 20 that corresponds in location to the groove 23 or on any proper location of the surface of the substrate 20.

Figure 12:
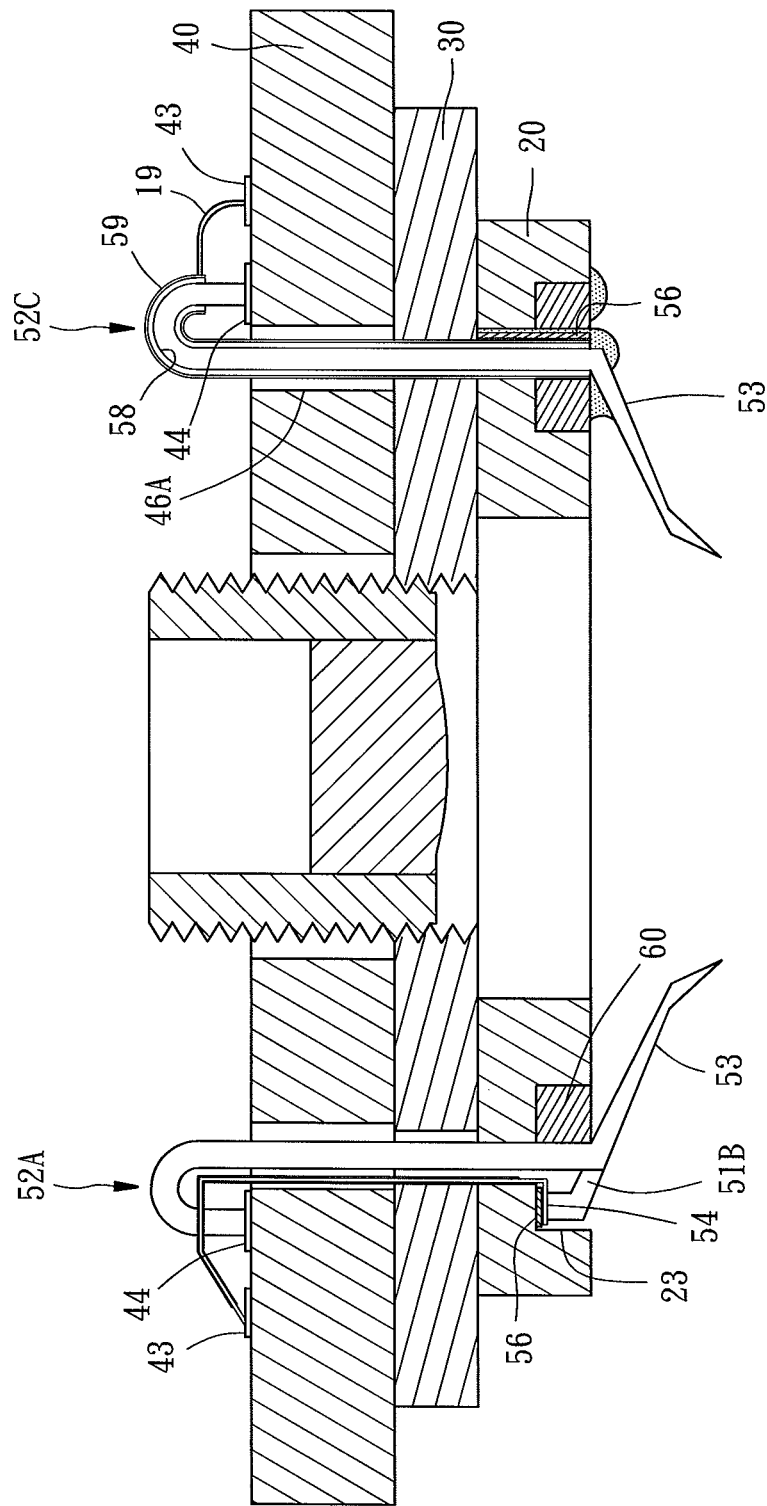
FIG. 12 is a cross-sectional view of the high frequency probe card of the present invention, showing another arrangement of the conductor of the probe module having the high-frequency impedance matching probes of the first kind and a third kind.
Figure 13:
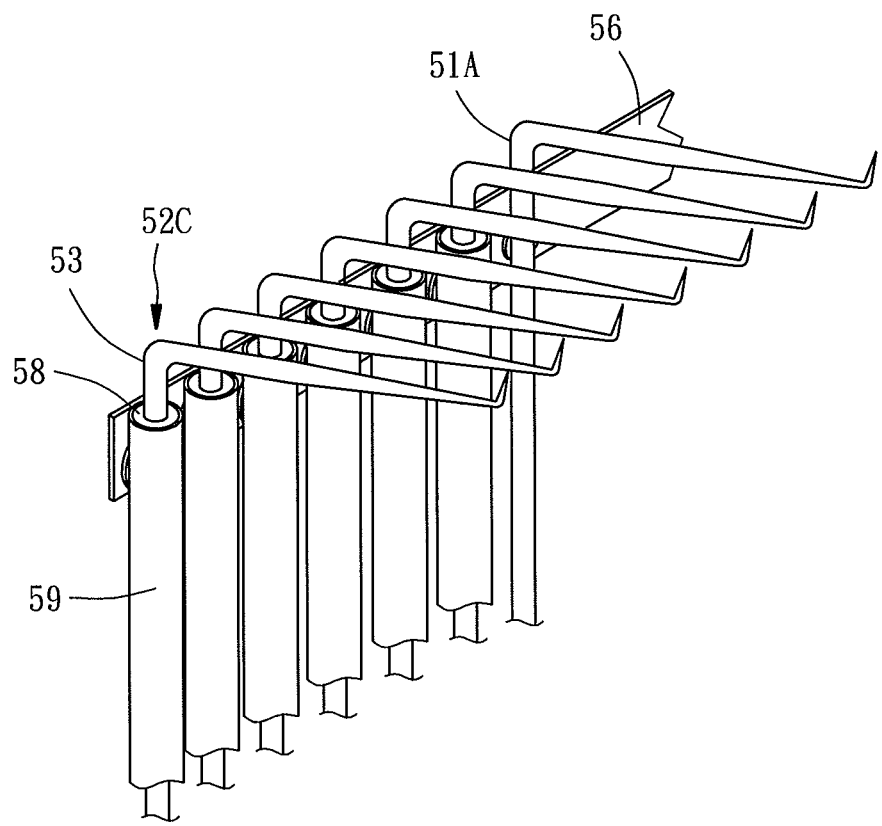
FIG. 13 is a schematic perspective view showing a probe module having the high-frequency impedance matching probes of the third kind and the ground probe of the first kind.

The probe module 50 may adopt the high-frequency impedance matching probes 52C shown in FIG. 13 and right side of FIG. 12. The high-frequency impedance matching probe 52C includes a needle 53 as described above, an insulation member 58 encapsulating around the needle 53, and a grounding conductive member 59 partially or completely encapsulating around the insulation member 58, such that the needle 53 and the grounding conductive member 59 form the signal transmitting structure and grounding structure of the high-frequency impedance matching probe 52C, respectively. The grounding conductive member 59 of the high-frequency impedance matching probe 52C is electrically connected with the ground probe, such as but not limited to the ground probe 51A shown in FIG. 13, via the conductor 56. The conductor 56 may be fixedly mounted in the groove 23 of the substrate 20 as shown in left side of FIG. 14. Alternatively, the conductor 56 may be insulatedly mounted on the detecting portion 536 of the needle 53, as shown in right side of FIG. 14, and electrically connected with the grounding conductive member 59 via a lead wire 19.

Figure 15:
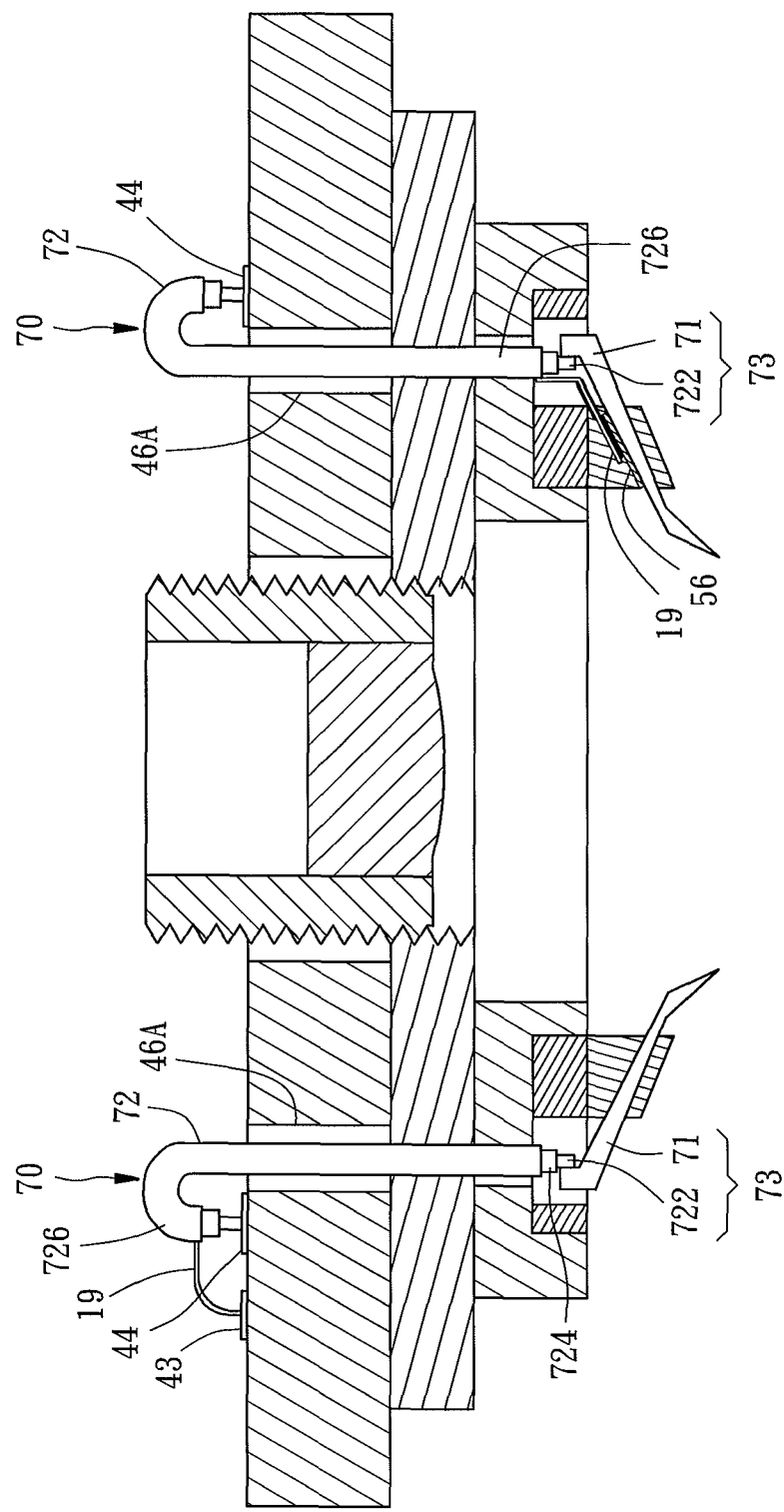
FIG. 15 is a cross-sectional view of the high frequency probe card of the present invention, in which high-frequency impedance matching probes of a fourth kind are shown.

The probe module 50 may also adopt the high-frequency impedance matching probes 70 shown in FIG. 15. The high-frequency impedance matching probe 70 is composed of a needle 71 and a coaxial wire 72. The needle 71 mainly includes an arm-like detecting portion for probing the DUT, and is electrically connected with the signal pad 44 via the coaxial wire 72. Specifically speaking, the coaxial wire 72 is composed of a core 722, an insulation member 724 encapsulating around the core 722, and a grounding conductive member 726 encapsulating around the insulation member 724. The needle 71 is connected with the core 722 of the coaxial wire 72, such that the needle 71 and the core 722 combinedly form the signal transmitting structure of the high-frequency impedance matching probe 70. On the other hand, the grounding structure of the high-frequency impedance matching probe 70 is formed by the grounding conductive member 726 of the coaxial wire 72. As shown in right side of FIG. 15, the grounding conductive member 726 is electrically connected with the conductor 56 that is electrically connected with the ground probe (not shown) via a lead wire 19, such that the grounding conductive member 726 is indirectly and electrically connected with the ground probe. The conductor 56 is insulatedly mounted on the needle 71.

Figure 14:
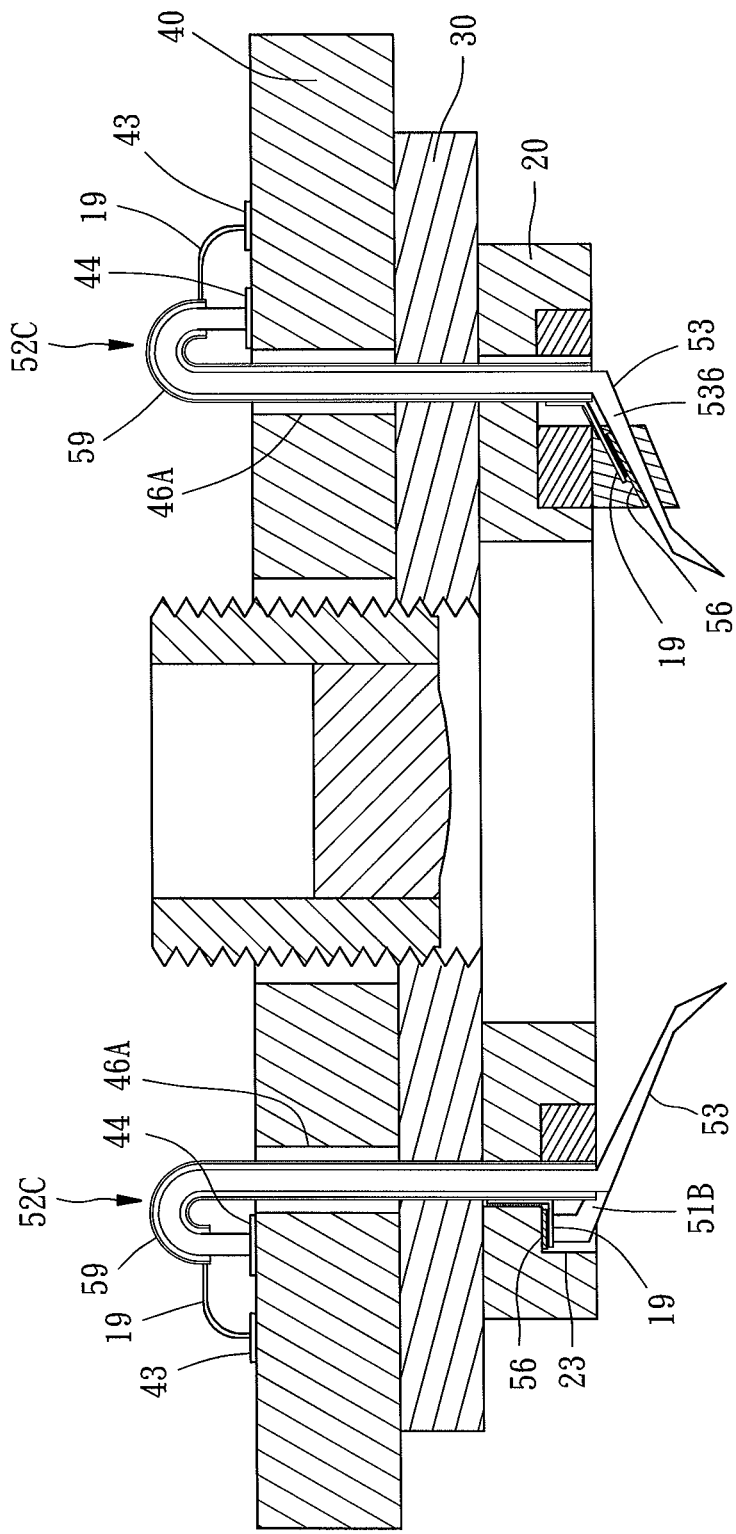
FIG. 14 is a cross-sectional view of the high frequency probe card of the present invention, showing two alternate arrangements of conductors of the probe module having the high-frequency impedance matching probes of the third kind.
Figure 16:
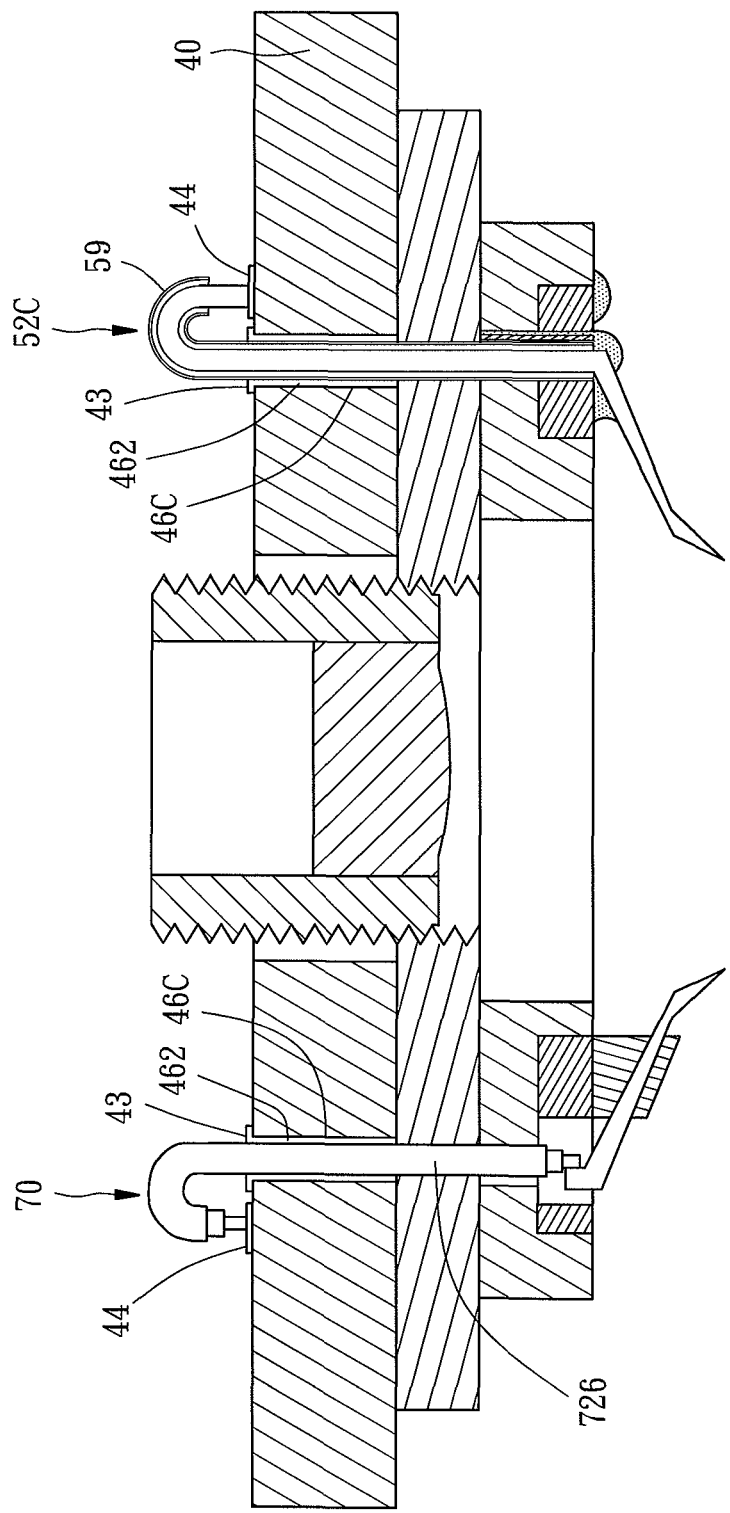
FIG. 16 is a cross-sectional view of the high frequency probe card of the present invention, showing that the circuit board has second conductive through holes in which the high-frequency impedance matching probes of the third and fourth kinds are respectively inserted.

In the embodiments shown in FIGS. 12, 14 and 15, the high-frequency impedance matching probes 52C and 70 are respectively inserted through the insulated through holes 46A of the circuit boards 40 and the grounding conductive members 59 and 726 are respectively and electrically connected with the ground pads 43 via lead wires 19. However, the third through holes of the circuit board 40 may include at least one second conductive through hole 46C as shown in FIG. 16. The second conductive through hole 46C has a hole wall provided with electrically conductive material 462, and an end of the second conductive through hole 46C is provided with or electrically connected through a circuit layout with a ground pad 43 that is electrically connected with the electrically conductive material 462. As shown in right side of FIG. 16, a high-frequency impedance matching probe 52C is inserted through the second conductive through hole 46C in a way that the grounding conductive member 59 of the high-frequency impedance matching probe 52C is firmly contacted with the electrically conductive material 462, such that the grounding conductive member 59 is electrically connected with the ground pad 43. As shown in left side of FIG. 16, a high-frequency impedance matching probe 70 is inserted through the second conductive through hole 46C is such a way that the grounding conductive member 726 of the high-frequency impedance matching probe 70 is electrically connected with the ground pad 43 via the electrically conductive material 462. Because the diameter of the high-frequency impedance matching probe 52C or 70 is greater that the diameter of bare ground probe or regular probe for transmitting low or intermediate frequency signal, the second conductive through hole 46C has a diameter greater than that of the first conductive through hole 46B adapted for insertion of the ground probe or the regular probe. In order to prevent the adverse affection to the arrangement of the grounding conductive member 59 due to the bending treatment of the high-frequency impedance matching probe 52C after the high-frequency impedance matching probe 52C passes through the third through hole 46A or 46C, the part of the grounding conductive member 59 above the top surface of the circuit board 40 as disclosed in right side of FIG. 12, left and right sides of FIG. 14 and right side of FIG. 16 may be arranged on the top surface of the circuit board 40 around the third through hole 46A or 46C, e.g. circling the third through hole 46A or 46C; therefore, the grounding conductive member 59 can be indirectly and electrically connected with the ground pad 43 on the top surface of the circuit board 40 via the lead wire 19 or directly and electrically connected with the ground pad 43 on the top surface of the circuit board 40 after the high-frequency impedance matching probe 52C passes through the third through hole 46A or 46C.

As indicated above, the high frequency probe card 10 provided by the present invention has the first, second and third openings 21, 31 and 45 for accommodation of the lens module 12 and for light transmission, so that the high frequency probe card 10 can be used to inspect photoelectric device. The high frequency probe card 10 may adopt any kind of high-frequency impedance matching probes 52A, 52B, 52C and 70 which have been detailedly illustrated in the preceding paragraphs for impedance matching with the tester and device under test; therefore, the high frequency probe card of the present invention can fulfill the requirement of high frequency testing. Further, the high-frequency impedance matching probes 52A, 52B, 52C and 70 are arranged to penetrate through the substrate 20, the interposing plate 30 and the circuit board 40 and electrically connected with the signal pads 44 on the top surface of the circuit board 40; therefore, the testing signal needs not to be transmitted through the internal circuit layout of the circuit board 40, so that the testing signal can be transmitted smoothly and the circuit board 40 can be more easily made. Furthermore, one of the third through holes 46A, 46B or 46C provided by the circuit board 40 is associated with one of the high-frequency impedance matching probes 52A, 52B, 52C or 70. That is, one third through hole is inserted with one high-frequency impedance matching probe only. Therefore, the high-frequency impedance matching probes can be well positioned and fixed and every high frequency probe card thus made may have consistent arrangement of the high-frequency impedance matching probes.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A high frequency probe card for probing a photoelectric device, the high frequency probe card comprising:
    a substrate having a first opening for light transmission, and at least one first through hole;
    an interposing plate disposed on the substrate and provided with a second opening communicated with the first opening for light transmission, and at least one second through hole communicated with the at least one first through hole;
    a circuit board having a top surface, a bottom surface disposed on the interposing plate, at least one ground pad and at least one signal pad arranged on the top surface, a third opening penetrating through the top and bottom surfaces and being communicated with the second opening for light transmission, and at least one third through hole penetrating through the top and bottom surfaces and being communicated with the at least one second through hole; and
    a probe module mounted to the substrate and provided with at least one ground probe and at least one high-frequency impedance matching probe having a signal transmitting structure and a grounding structure, the signal transmitting structure and the grounding structure passing through the at least one first, second and third through holes and being electrically connected with the signal pad and the ground pad of the circuit board, respectively,
    wherein the probe module comprises a conductor, the signal transmitting structure is insulated from the conductor by an insulated member, and the grounding structure and the at least one ground probe are electrically connected together by the conductor.

2. The high frequency probe card as claimed in claim 1, wherein the circuit board comprises a plurality of said third though holes and the probe module comprises a plurality of said high-frequency impedance matching probes each passing through one of said third through holes.

3. The high frequency probe card as claimed in claim 1, wherein the circuit board comprises a plurality of said third though holes; the at least one ground probe and the at least one high-frequency impedance matching probe each pass through one of said third through holes.

4. The high frequency probe card as claimed in claim 3, wherein the third through holes comprise a conductive through hole having a hole wall provided with an electrically conductive material; the ground probe is inserted in the conductive through hole and electrically connected with the ground pad through the electrically conductive material of the conductive through hole.

5. The high frequency probe card as claimed in claim 1, wherein the high-frequency impedance matching probe comprises a needle and a lead wire configured in a way that the needle and the lead wire are electrically insulated from each other; the needle forms the signal transmitting structure of the high-frequency impedance matching probe, and the lead wire forms the grounding structure of the high-frequency impedance matching probe.

6. The high frequency probe card as claimed in claim 5, wherein the at least one third through hole of the circuit board comprises an electrically insulated through hole through which the high-frequency impedance matching probe is inserted.

7. The high frequency probe card as claimed in claim 1, wherein the high-frequency impedance matching probe comprises a needle, an insulation member encapsulating the needle, and a grounding conductive member having at least a part encapsulating the insulation member; the needle forms the signal transmitting structure of the high-frequency impedance matching probe, and the grounding conductive member forms the grounding structure of the high-frequency impedance matching probe.

8. The high frequency probe card as claimed in claim 7, wherein the at least one third through hole comprises a conductive through hole having a hole wall provided with an electrically conductive material; the high-frequency impedance matching probe is inserted in the conductive through hole in a way that the grounding conductive member is electrically connected with the ground pad through the electrically conductive material of the conductive through hole.

9. The high frequency probe card as claimed in claim 7, wherein the at least one third through hole comprises a first conductive through hole having a hole wall provided with an electrically conductive material, and a second conductive through hole having a hole wall provided with an electrically conductive material; the second conductive through hole has a diameter larger than that of the first conductive through hole; the high-frequency impedance matching probe is inserted in the second conductive through hole in a way that the grounding conductive member is electrically connected with the ground pad through the electrically conductive material of the second conductive through hole.

10. The high frequency probe card as claimed in claim 1, wherein the high-frequency impedance matching probe comprises a needle and a coaxial wire having a core, an insulation member encapsulating the core, and a grounding conductive member encapsulating the insulation member; the needle and the core of the coaxial wire are connected with each other to combinedly form the signal transmitting structure of the high-frequency impedance matching probe, and the grounding conductive member of the coaxial wire forms the grounding structure of the high-frequency impedance matching probe.

11. The high frequency probe card as claimed in claim 10, wherein the at least one third through hole comprises a conductive through hole having a hole wall provided with an electrically conductive material; the high-frequency impedance matching probe is inserted in the conductive through hole in a way that the grounding conductive member of the coaxial wire is electrically connected with the ground pad through the electrically conductive material of the conductive through hole.

12. The high frequency probe card as claimed in claim 10, wherein the at least one third through hole comprises a first conductive through hole having a hole wall provided with an electrically conductive material, and a second conductive through hole having a hole wall provided with an electrically conductive material; the second conductive through hole has a diameter larger than that of the first conductive through hole; the high-frequency impedance matching probe is inserted in the second conductive through hole in a way that the grounding conductive member of the coaxial wire is electrically connected with the ground pad through the electrically conductive material of the second conductive through hole.

13. The high frequency probe card as claimed in claim 1, wherein the at least one second through hole of the interposing plate is an elongated through hole.

14. The high frequency probe card as claimed in claim 1, wherein the at least one first through hole of the substrate is an elongated through hole.

15. The high frequency probe card as claimed in claim 1, wherein the substrate comprises a plurality of said first through holes; each of the ground probe and the high-frequency impedance matching probe is inserted through one of said first through holes.

16. The high frequency probe card as claimed in claim 1, wherein the grounding structure of the high-frequency impedance matching probe has two ends electrically connected with the ground pad and the ground probe, respectively.

17. The high frequency probe card as claimed in claim 1, further comprising a lens module screwingly threaded to a wall of the second opening of the interposing plate.

* * * * *